(12) United States Patent
Yeh et al.

(10) Patent No.: US 11,539,183 B2
(45) Date of Patent: Dec. 27, 2022

(54) PASSIVE THERMAL MANAGEMENT FOR SEMICONDUCTOR LASER BASED LIDAR TRANSMITTER

(71) Applicant: Beijing Voyager Technology Co., Ltd., Beijing (CN)

(72) Inventors: Yu-Ching Yeh, Mountain View, CA (US); Yue Lu, Mountain View, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 204 days.

(21) Appl. No.: 17/131,548

(22) Filed: Dec. 22, 2020

(65) Prior Publication Data

US 2022/0200235 A1 Jun. 23, 2022

(51) Int. Cl.
| | |
|---|---|
| *H01S 3/04* | (2006.01) |
| *H01S 5/024* | (2006.01) |
| *H01S 5/40* | (2006.01) |
| *H01S 5/0237* | (2021.01) |
| *H01S 5/02* | (2006.01) |
| H05K 1/02 | (2006.01) |
| H05K 7/20 | (2006.01) |
| H01S 5/042 | (2006.01) |
| G01S 17/931 | (2020.01) |
| G01S 7/481 | (2006.01) |
| H05K 3/42 | (2006.01) |
| H05K 3/34 | (2006.01) |
| *H01S 5/02315* | (2021.01) |
| *H01S 5/0232* | (2021.01) |

(52) U.S. Cl.
CPC ........ *H01S 5/02469* (2013.01); *H01S 5/0216* (2013.01); *H01S 5/0237* (2021.01); *H01S 5/02476* (2013.01); *H01S 5/4025* (2013.01); *G01S 7/4815* (2013.01); *G01S 17/931* (2020.01); *H01S 5/0232* (2021.01); *H01S 5/02315* (2021.01); *H01S 5/042* (2013.01); *H05K 1/0206* (2013.01); *H05K 3/34* (2013.01); *H05K 3/423* (2013.01); *H05K 7/20445* (2013.01); *H05K 2201/09563* (2013.01)

(58) Field of Classification Search
CPC .. H01S 5/02469; H01S 5/0216; H01S 5/0237; H01S 5/02476; H01S 5/4025; H01S 5/02315; H01S 5/0232; H01S 5/042; G01S 7/4815; G01S 17/931; H05K 1/0206; H05K 3/34; H05K 3/423; H05K 7/20445; H05K 2201/09563
See application file for complete search history.

(56) References Cited

U.S. PATENT DOCUMENTS

| | | |
|---|---|---|
| 2002/0121098 A1 | 9/2002 | Baker |
| 2006/0029115 A1 | 2/2006 | Park et al. |
| 2009/0219966 A1 | 9/2009 | Tan et al. |

(Continued)

*Primary Examiner* — Kinam Park
(74) *Attorney, Agent, or Firm* — Kilpatrick Townsend & Stockton LLP

(57) ABSTRACT

A laser package is mounted on the printed circuit board. At least one thermal via extends through the printed circuit board, coupled to the laser package. A thermal bridge is coupled to the at least one thermal via on the bottom of the printed circuit board. A thermal paste connects the thermal bridge to a conductive ground plane on the bottom of the printed circuit board, and to a mechanical housing.

20 Claims, 10 Drawing Sheets

(56) References Cited

U.S. PATENT DOCUMENTS

| | | |
|---|---|---|
| 2013/0156368 A1 | 6/2013 | Hanjani |
| 2013/0294096 A1 | 11/2013 | Petroski |
| 2014/0147127 A1* | 5/2014 | McColloch ......... H01S 5/02469 |
| | | 398/135 |
| 2014/0353515 A1* | 12/2014 | Fujita .................... H04N 5/378 |
| | | 250/370.09 |
| 2015/0221846 A1 | 8/2015 | Terauchi et al. |
| 2016/0227641 A1* | 8/2016 | Ku ......................... H05K 1/112 |
| 2017/0164510 A1 | 6/2017 | Bucher |
| 2018/0019569 A1 | 1/2018 | Law et al. |
| 2021/0267043 A1* | 8/2021 | Yoo ..................... H05K 1/0206 |
| 2022/0068817 A1* | 3/2022 | Li ....................... H05K 1/0206 |

\* cited by examiner

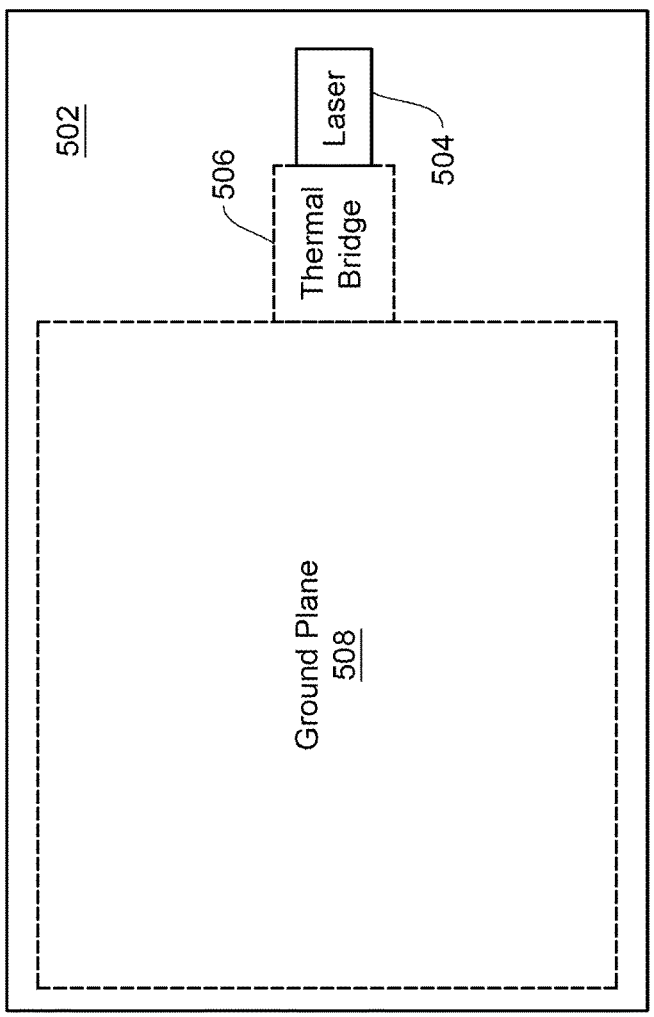
FIG. 5
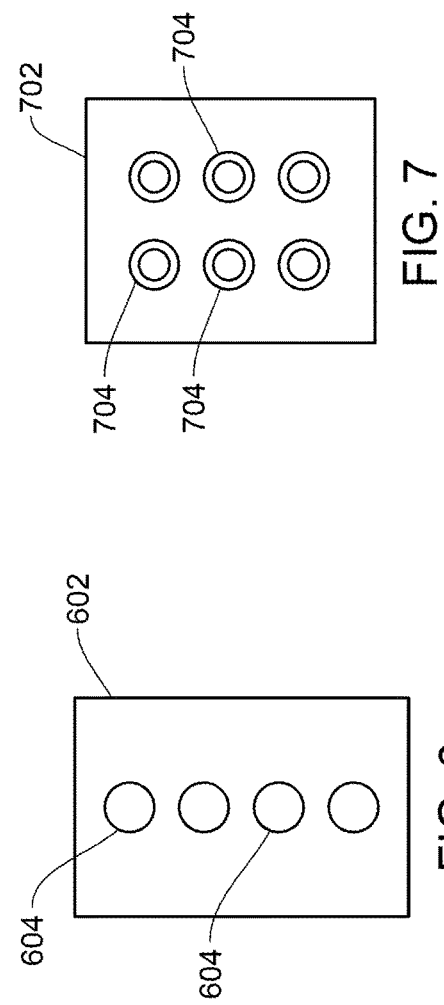
FIG. 7
FIG. 6

|  | Thermal conductivity (W/mk) | Length (m) | Area (m₂) | Thermal resistance (dC/W) | # of parallel paths (vias) | Total therm R |
|---|---|---|---|---|---|---|
| Laser Chip | 55 | 1.15E-04 | 8.10E-07 | 2.58E+00 | 1 | 2.58E+00 |
| Laser Adhesive | 1.8 | 5.00E-06 | 8.10E-07 | 3.43E+00 | 1 | 3.43E+00 |
| Cathode Contact | 390 | 2.50E-04 | 5.62E-07 | 1.14E+00 | 1 | 1.14E+00 |
| Solder Paste | 57 | 7.50E-05 | 5.62E-07 | 2.34E+00 | 1 | 2.34E+00 |
| Copper Filled via, 8mil diam | 390 | 8.00E-04 | 3.24E-08 | 6.33E+01 | 4 | 1.58E+01 |
| Thermal Bridge 0505 (BeO) |  |  |  | 7.00E+00 | 2 | 3.50E+01 |
|  |  |  |  |  | Total | 2.88E+01 |

FIG. 8

PASSIVE THERMAL MANAGEMENT FOR SEMICONDUCTOR LASER BASED LIDAR TRANSMITTER

BACKGROUND OF THE INVENTION

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a micro-mirror can be connected to a substrate via a connection structure (e.g., a torsion bar, a spring, etc.) to form a pivot point. One such type of micro-mirror assembly can be a micro-electro-mechanical system (MEMS)-type structure that may be used for a light detection and ranging (LiDAR) system in an autonomous vehicle, which can be configured for detecting obstructions and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

In a LiDAR system, the transmitter (e.g., laser diode) generally consumes a large portion of the total power as it is the fundamental "energy source". Inevitably, the amount of heat generated will also be very large due to this large power consumption. This is a significant problem, particularly for multi-element laser sources that are running at a high repetition rate. Heat will degrade the laser performance (e.g. peak power, wavelength shift, efficiency) and its reliability. Approximately 70% of the energy supplied to a laser diode is wasted as heat. Thus, heat dissipation is needed to limit the temperature change of the laser diode. Typical solutions to dissipating the heat of a laser diode can be bulky and expensive. Large heat sinks can be used. Also, Peltier devices are used.

BRIEF SUMMARY OF THE INVENTION

Techniques disclosed herein relate generally to passive thermal management of semiconductor lasers that can be used in, for example, light detection and ranging (LiDAR) systems or other light beam steering systems. More specifically, and without limitation, disclosed herein is an apparatus and method for using a thermal via and thermal bridge to dissipate heat from a laser diode.

In one embodiment, a laser package is mounted on a printed circuit board. At least one thermal via extends through the printed circuit board, coupled to the laser package. A thermal bridge is coupled to the at least one thermal via on the bottom of the printed circuit board. A thermal paste connects the thermal bridge to a conductive ground plane on the bottom of the printed circuit board, and to a mechanical housing. The thermal bridge has a high electrical resistance, minimizing any effect on the laser driving circuitry, while having a low thermal resistance, thereby providing a path for heat transfer away from the semiconductor laser.

According to certain embodiments, a plurality of laser diodes in parallel are used. A solder paste couples the N-node of the laser diodes to a trace on the printed circuit board. The trace connects to a FET that switches the laser diodes on and off, with the FET being driven by a laser driver circuit.

According to certain embodiments, the thermal via is connected to a conductive pad on the bottom of the printed circuit board. A solder paste connects the conductive pad to the thermal bridge. The thermal via can be multiple vias, each formed by electroplating copper in the via hole. The vias can have hollow centers, like standard electrical connection vias, or can be completely filled to produce a solid via that conducts more heat. The cross-section of each via is comparable to the cross-section of the trigger trace. This design has been shown to reduce the temperature of the laser diode significantly—from nearly 100° Celsius to only 10° Celsius.

In one embodiment, the thermal bridge is a layer or strip of Beryllium oxide (BeO), an electrical insulator with high thermal conductivity. The thermal bridge will add some parasitic capacitance, proportional to the size of the thermal bridge. Thus, the size of the thermal bridge is chosen to be large enough to provide sufficient heat transfer, but small enough to minimize the parasitic capacitance and its effect on the laser pulse.

According to certain embodiments, a method is provided for dissipating heat from a semiconductor laser. The method includes forming a thermal via through a printed circuit board; forming a conductive ground plane on the bottom of the printed circuit board; mounting a laser package on the printed circuit board, coupled to the thermal via; coupling a thermal bridge to the thermal via; connecting a thermal paste to the thermal bridge and to the conductive ground plane; and connecting the thermal paste to a mechanical housing.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to the appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention, will be more apparent from the following detailed description taken in conjunction with the accompanying drawings, in which:

FIG. 5 is a diagram of a laser diode thermal connection to a ground plane according to an embodiment;

FIG. 6 is a diagram showing multiple solid thermal vias connecting to a laser diode package according to an embodiment;

FIG. 7 is a diagram showing multiple hollow thermal vias connecting to a laser diode package according to an embodiment;

FIG. 8 is a table of an example set of components and their thermal resistance according to an embodiment;

DETAILED DESCRIPTION OF THE INVENTION

Figure 1:
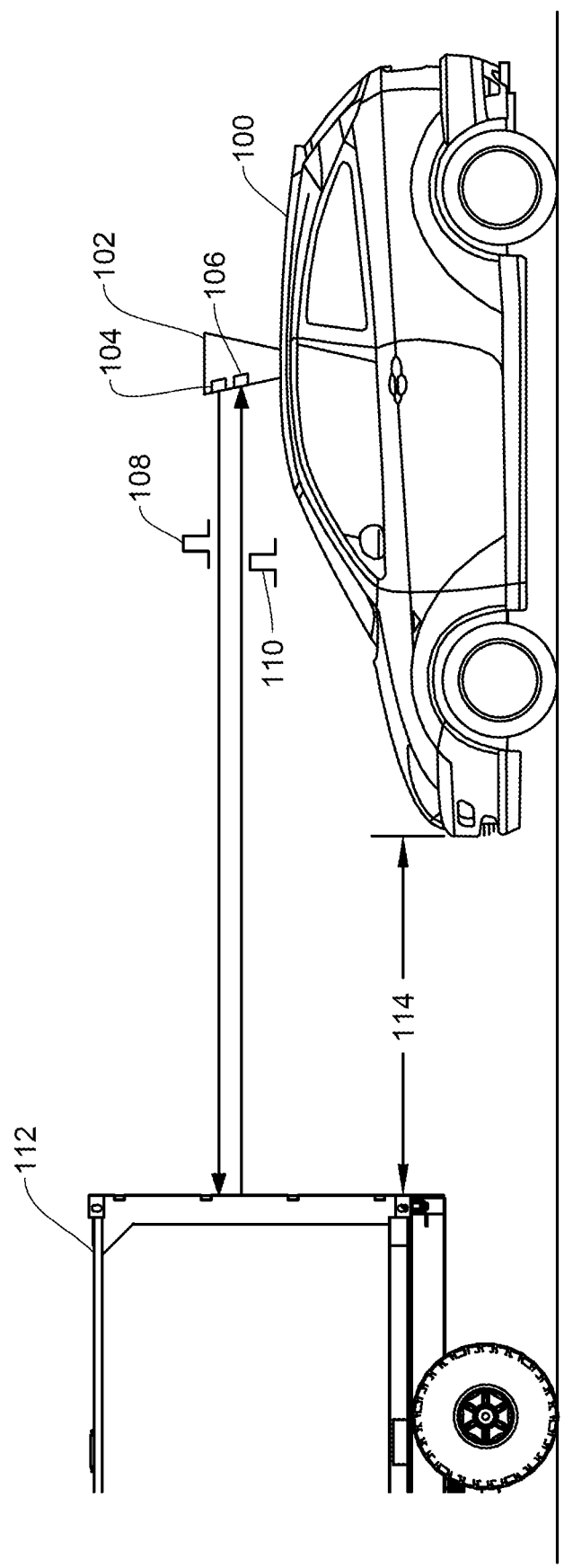
FIG. 1 shows an autonomous vehicle with a LiDAR system, according to certain embodiments.

Aspects of the present disclosure relate generally to a LiDAR system, and more particularly to scanning an environment with a laser having a controlled wavelength.

In the following description, various examples of passive thermal management of laser structures are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Semiconductor lasers in a LiDAR system are pulsed at high frequencies to scan an environment in a short time. They need to be pulsed at sufficient power to allow the reflected pulses to be detected. The high power and frequencies heat the semiconductor laser, and over time the heating will degrade the semiconductor laser and its performance. Thus, thermal management and providing a heat dissipation path is critical. Because LiDAR pulses are used, instead of a continuous activation of the laser diode, parasitic capacitance should be minimized to avoid degrading the shape of the pulse. A ceramic PCB could be used to provide the heat transfer needed itself, but is expensive. A metal core PCB (MCPCB) also has good heat transfer characteristics, but is not rigid enough for usage in a LiDAR system, where the laser diode beam needs to be precisely aligned with the optics, and bending of the PCB could cause misalignment problems. Limiting the temperature of the laser diode improves the performance of the system and extends the lifetime of the laser diode.

The following high level summary is intended to provide a basic understanding of some of the novel innovations depicted in the figures and presented in the corresponding descriptions provided below. Techniques disclosed herein relate generally to passively thermal managed lasers that can be used in, for example, light detection and ranging (LiDAR) systems or other light beam steering systems.

More specifically, and without limitation, disclosed herein are embodiments, illustrated in FIGS. 3-7, where, a structure that uses a rigid laminate PCB 314 to support a semiconductor laser package 308 is provided (alternately, a bare die without packaging could be used). Since the PCB has poor thermal conductivity, a thermal via 316 is used. The thermal via connects to a thermal bridge 322 on the bottom of the PCB. The thermal bridge can be any material with high electrical resistance and low thermal resistance. The high electrical resistance avoids an unwanted drain of electricity and unwanted parasitic capacitance.

The thermal bridge connects to a ground plane 326 using a thermal paste 324. This leverages the large area of the ground plane for head dissipation. The thermal paste connects to a mechanical housing for the structure, which may be a heat sink, or may be connected to a heat sink or a water cooler 334 (alternately, an air cooler could be used). The thermal bridge can introduce parasitic capacitance, and thus the size of the thermal bridge is a trade-off between maximizing heat transfer and minimizing the parasitic capacitance (which degrades the LiDAR laser pulse shape).

Generally, aspects of the invention are directed to implementations of light steering, which can be used in a number of different applications. For example, a Light Detection and Ranging (LiDAR) module of an autonomous vehicle may incorporate a light steering system. The light steering system can include a transmitter and receiver system to steer emitted incident light in different directions around a vehicle, and to receive reflected light off of objects around the vehicle using a sequential scanning process, which can be used to determine distances between the objects and the vehicle to facilitate autonomous navigation.

Light steering can be implemented by way of micro-mirror assemblies as part of an array, with each micro-mirror assembly having a movable micro-mirror and an actuator (or multiple actuators). The micro-mirrors and actuators can be formed as microelectromechanical systems (MEMS) on a semiconductor substrate, which allows for the integration of the MEMS with other circuitries (e.g., controller, interface circuits, etc.) on the semiconductor substrate, which can allow for simpler, easier, more robust, and cost-effective manufacturing processes.

Typical System Environment for Certain Embodiments of the Invention

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
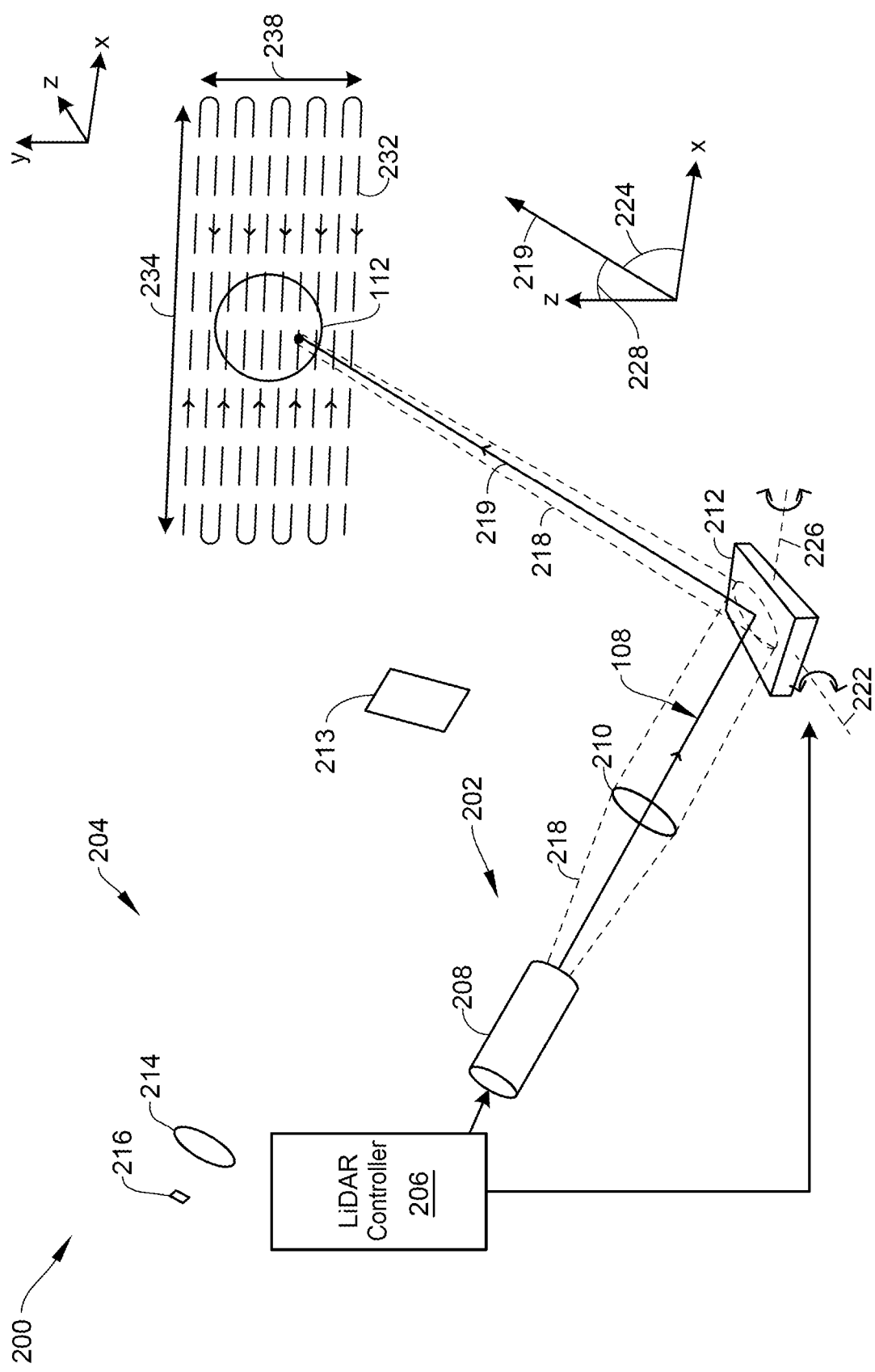
FIG. 2A shows an example of a light projection operation, according to certain embodiments.
Figure 2B:
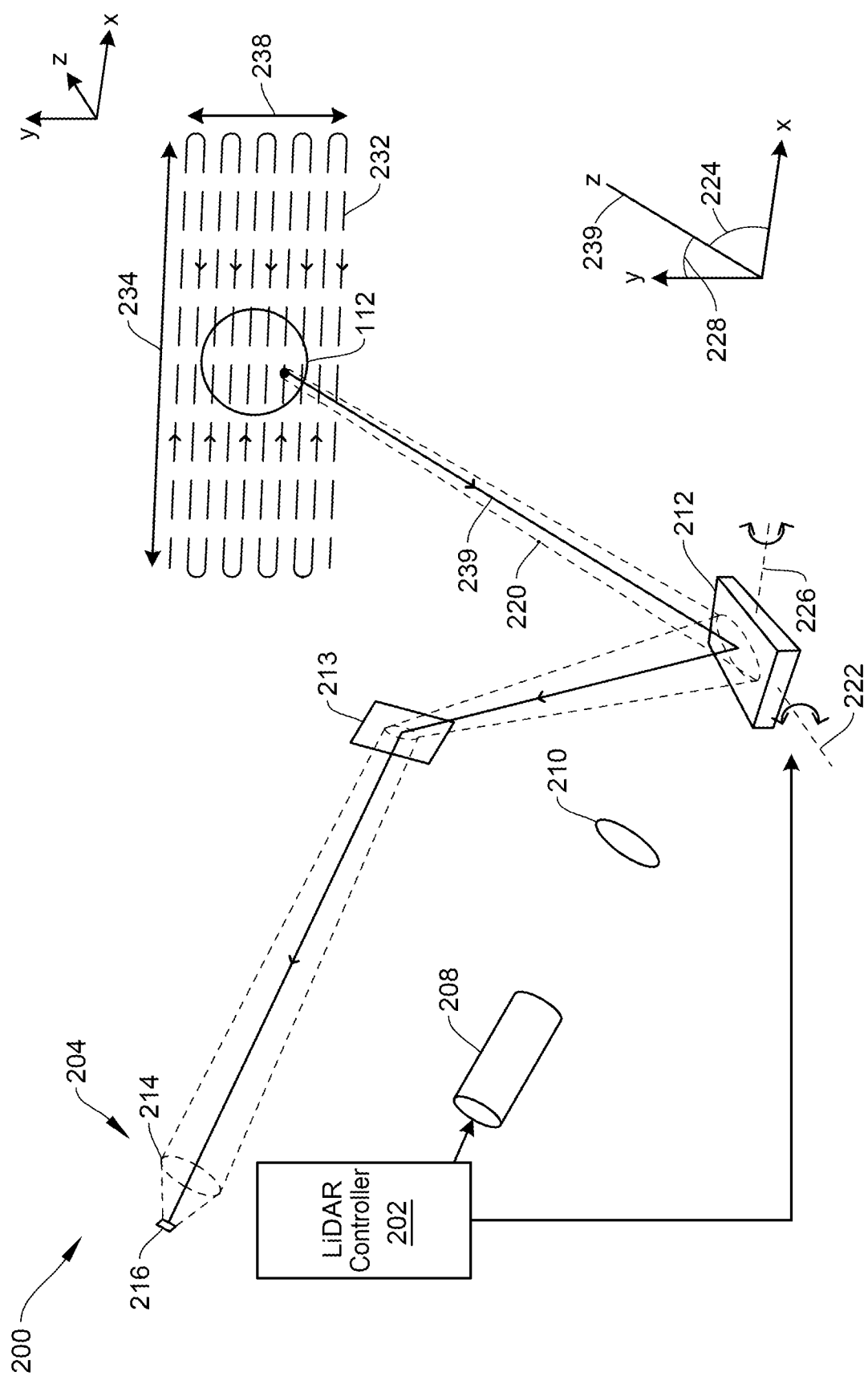
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form a reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Passive Thermal Management

Figure 3:
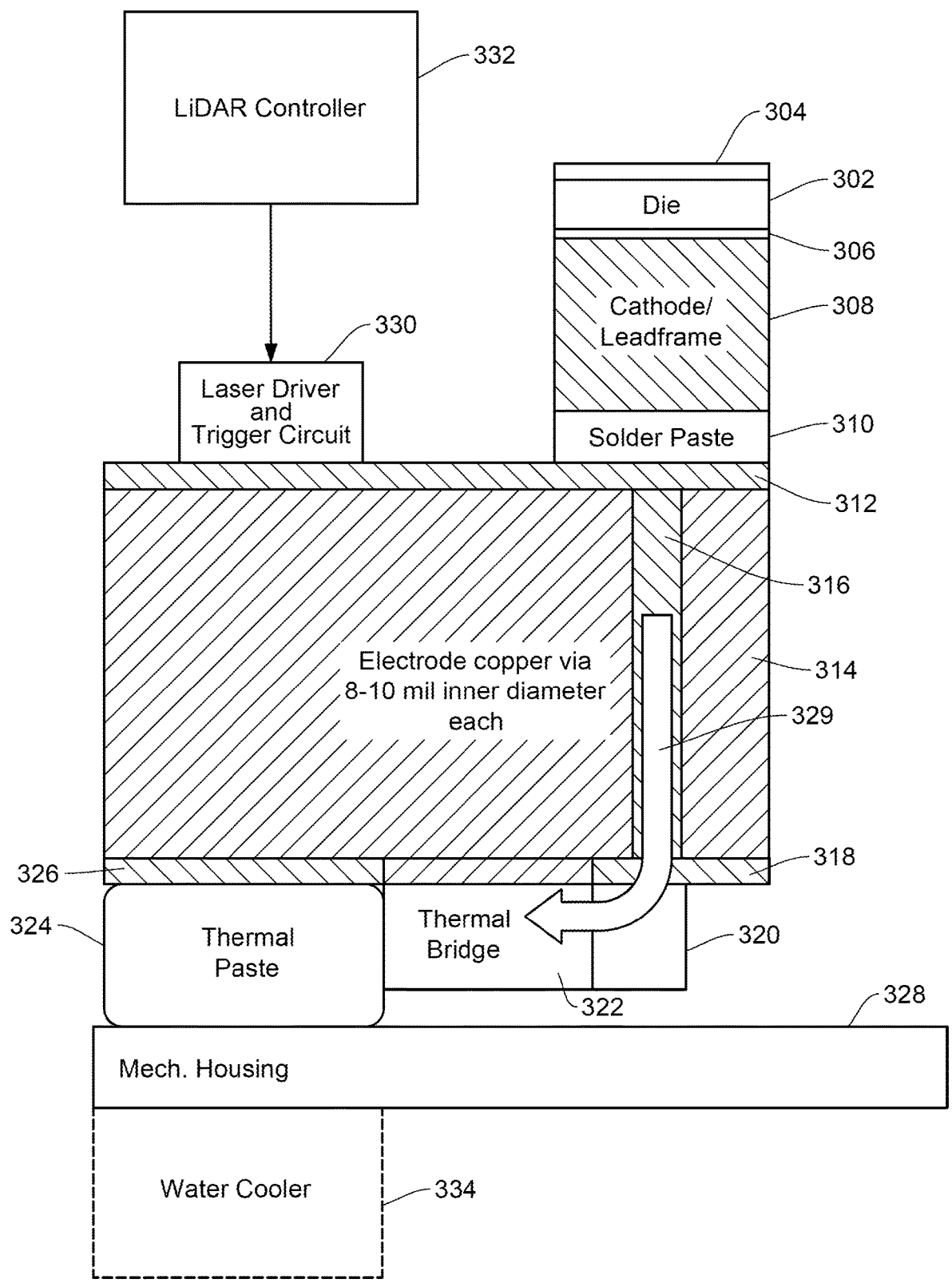
FIG. 3 is a cut-away view of a passive thermal management system for a laser diode, according to certain embodiments.

FIG. 3 is a cut-away view of a passive thermal management system for a laser diode, according to certain embodiments. At least one semiconductor laser diode is formed on a die 302, with a P junction contact 304 on top, and an N junction contact 306 on the bottom. The N junction contact 306 is attached to a cathode/leadframe 308 of a laser chip package. The cathode/leadframe 308 is connected via solder paste 310 to a metal trace 312 on a printed circuit board (PCB) 314.

A thermal via 316 connects trace 312 to a conductive pad 318 on the bottom of PCB 314. Solder paste 320 connects conductive pad 318 to a thermal bridge 322, which in turned is connected through thermal paste 324 to a ground plane conductor 326 on the bottom of PCB 314 (solder paste 320 could be replaced with thermal paste, but with higher parasitic capacitance). Thermal paste 324 also connects to a mechanical housing 328. A low thermal resistance path 329 is formed through thermal via 316, pad 318, thermal bridge 322, thermal paste 324, and ground plane 326.

A laser driver and trigger circuit 330 is connected to trace 312 to provide a trigger signal to turn on the laser in die 302. The trigger control passes through trace 312, solder paste 310, cathode/leadframe 308 to the N junction contact 306 of the laser diode. A LiDAR controller 332 provides a control signal to laser driver and trigger circuit 330 to pulse the laser at a desired pulse rate.

Because LiDAR pulses are used, instead of a continuous activation of the laser diode, parasitic capacitance is minimized to avoid degrading the shape of the pulse. If contact 318 were connected directly to mechanical housing 328 using solder paste or thermal paste, it would add undesirable additional parasitic capacitance. The use of thermal bridge 322 provides electrical isolation from the thermal paste and ground plane, avoiding excess parasitic capacitance. By connecting to the ground plane through the thermal bridge, the large size of the ground plane can be leverage to provide additional heat dissipation. Optionally, a water cooling module 334 could be added to provide further heat dissipation.

A ceramic PCB could be used to provide the heat transfer needed itself, avoiding the via of embodiments of the invention. However, ceramic is expensive. Alternately, a metal core PCB (MCPCB) could be used. However, an MCPCB generally is not rigid enough for usage in a LiDAR system, where the laser diode beam needs to be precisely aligned with the optics, and bending of the PCB could cause misalignment problems. Thus, in embodiments, the PCB is a rigid laminate, such as an FR-4 laminate. An FR-4 laminate is sufficiently rigid, and is less expensive than ceramic. However, it has poor thermal conductivity, which is addressed with the thermal via described herein. Other laminates include CEM-1 and G-10.

Thermal bridge 322 is any material or device that has high electrical resistance and low thermal resistance. The high electrical resistance avoids an unwanted drain of electricity and unwanted parasitic capacitance. The low thermal resistance provides a heat dissipation path to keep the laser diode from overheating and thus degrading over time. A high resistance resistor would perform this function. In one embodiment, the thermal bridge is a layer or strip of Beryllium oxide (BeO), also known as beryllia. BeO is an inorganic compound with the formula BeO. It is an electrical insulator with a higher thermal conductivity than most other non-metal compounds (except diamond). The thermal bridge will add some parasitic capacitance, proportional to the size of the thermal bridge. Thus, the size of the thermal bridge is chosen to be large enough to provide sufficient heat transfer, but small enough to minimize the parasitic capacitance and its effect on the laser pulse. In one embodiment, the size of the thermal bridge is between (1) Width 0.03 in.×Length 0.02 in.×Thickness 0.02 in. and (2) Width 0.1 in.×Length 0.2 in.×Thickness 0.04 in.

Thermal paste 324 is a thermally conductive chemical compound that is usually, but not necessarily, electrically insulating. In embodiments, thermal paste consists of a polymerizable liquid matrix and large volume fractions of electrically insulating, but thermally conductive filler. The matrix materials can be epoxies, silicones, urethanes, and acrylates; solvent-based systems, hot-melt adhesives, and pressure-sensitive adhesive tapes. The filler can be aluminum oxide, boron nitride, zinc oxide, or aluminum nitride. The filler can be up to 70-80% of the thermal paste.

An electrically conductive thermal paste can be used in some embodiments, since thermal bridge 322 provides electrical isolation. One example is micronized silver particles suspended in a silicone/ceramic medium. Another thermal paste is liquid metal, such as the alloy galinstan.

Thermal via 316 in one embodiment is electroplated copper with an 8-10 millimeter diameter. Trace 312 and pad 318 are also copper. A standard via used for electrical conduction can be used, which typically are formed using electroplating of a via hole to build up the copper, and usually leave the center hollow or open. To provide additional thermal conductivity, additional vias can be used, and/or a larger sized via. Alternately, the entire via hole can be filled to provide a solid copper via. To provide sufficient thermal conduction, the size of thermal via 316 is comparable to the size of trace 312. Generally a trace size is 5 mils-20 mils (examples include 8 mil, 10 mil, 12 mil). The thermal vias conduct heat well because they are electroplated by copper (solid via) and a large number of them can be used to conduct heat.

Figure 4:
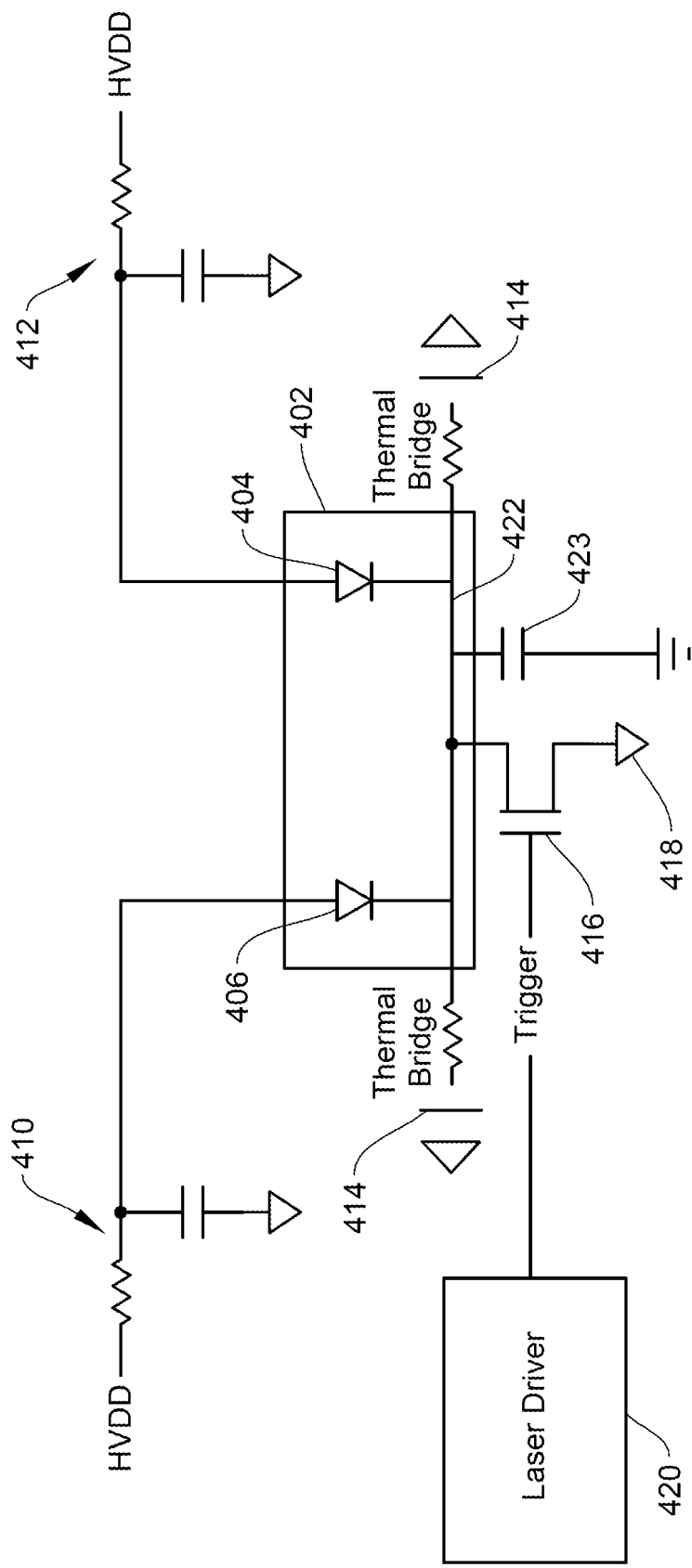
FIG. 4 is a diagram of a laser diode control circuit with a thermal bridge according to an embodiment.

FIG. 4 is a diagram of a laser diode control circuit with a thermal bridge according to an embodiment. A laser diode chip 402 with two laser diodes is shown. Laser diodes 404 and 406 are connected. Alternately, a laser diode chip with two, three, four, five, or any other number of laser diodes could be used. In another variation, the laser diodes can be separately driven, instead of being coupled in parallel. The additional laser diodes provide the amount of energy needed for a LiDAR system. Voltage supply HVDD provides power to the laser diodes through RC circuits 410, 412. An FET transistor 416 is triggered to provide a connection of the N node contact of the laser diodes to ground 418. The trigger is provided by a laser driver 420. The drain of FET 416 is connected to the N-node of the laser diodes. FET 416 is a GAMFET in one embodiment. Alternately, a JFET or MOSFET transistor could be used, or any other type of FET.

FIG. 5 is a diagram of a laser diode thermal connection to a ground plane according to an embodiment. Alternately, instead of a ground plane, any large exposed metal area for heat dissipation and heat sink purposes can be used. In one embodiment, it is a heat sink, and not a ground plane or metal plate. A laser diode chip 504 is positioned near the edge of a PCB 502 so that it can be close to a lens. Thermal bridge 506 on the bottom of the PCB connects to a ground plane 508 on the bottom. The ground plane is much larger than the laser chip 504, providing a large area for heat transfer and heat dissipation.

FIG. 6 is a diagram showing multiple solid thermal vias connecting to a laser diode package according to an embodiment. A laser chip package 602 connects to multiple vias 604. The entire via hole can be filled to provide a solid copper via. To provide additional thermal conductivity, additional vias can be used as shown. Alternately, larger sized via can be used. In one embodiment, the larger via fits entirely within the footprint of the laser chip. However, a larger via hole is more difficult and thus expensive to fill with copper, making a number of smaller holes an easier and less expensive option.

FIG. 7 is a diagram showing multiple hollow thermal vias connecting to a laser diode package according to an embodiment. A laser chip package 702 connects to multiple vias 704. A standard via used for electrical conduction is used, which is formed using electroplating of a via hole to build up the copper, leaving the center hollow or open.

FIG. 8 is a table of an example set of components and their thermal resistance according to an embodiment.

Temperature Effect on Alignment

A soft material PCB may bend with temperature. Thus, with changes of temperature, the laser may tilt. This tilting changes the alignment of the laser with the optics used in a LiDAR system, such as the lenses and the micro mirrors used to scan the laser beam across an environment to be detected. Some consequences of misalignment include: (1) worse (larger) laser beam quality and thus larger energy loss, resulting in a shorter detection distance; (2) worse (larger) laser beam quality and thus worse resolution; and (3) the laser beam location can shift, resulting in in accuracy in the point cloud's position. By choosing a rigid PCB, the change of alignment is limited.

LEDs and laser diodes are temperature sensitive, and high temperature operation impacts their overall lifetime. For example, operating a laser diode at 10° C. higher than its rated value will cut the lifetime of the laser diode in half. Additionally, a laser diode will typically stop functioning above 100° C. The degradation modes that result in failures or gradual degradation of laser diodes can be modelled using Arrhenius relationships where each degradation mode carries a specific activation energy. For example in reliability tests in which lifetime is based on temperature aging the relationship is life=A $e^{Ea/kT}$. The primary degradation modes are: (1) dislocations that affect the inner region; (2) metal diffusion and alloy reaction that affect the electrode; (3) solder instability (reaction and migration) that affect the bonding parts; (3) separation of metals in the heat sink bond; and (4) defects in buried heterostructure devices. These modes are enhanced by current during ambient temperature operations.

Figure 9:
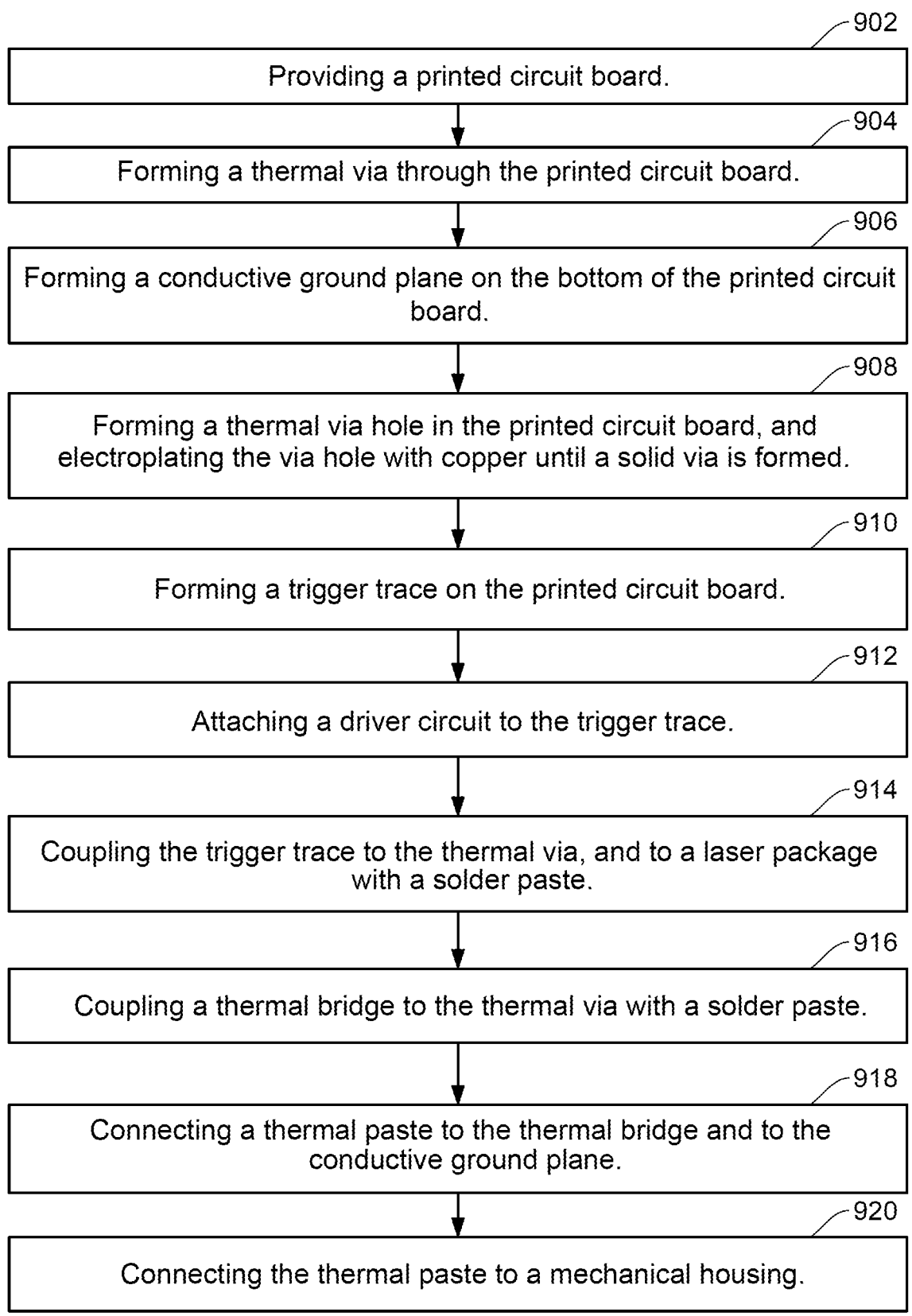
FIG. 9 is a flowchart of a method for making a thermal management assembly according to embodiments of the present invention.

FIG. 9 is a flowchart of a method for making a thermal management assembly according to embodiments of the present invention. The method comprises:

Providing a printed circuit board (step 902);

Forming a thermal via through the printed circuit board (step 904);

Forming a conductive ground plane on the bottom of the printed circuit board (step 906);

Forming a thermal via hole in the printed circuit board, and electroplating the via hole with copper until a solid via is formed (step 908);

Forming a trigger trace on the printed circuit board (step 910):

Attaching a driver circuit to the trigger trace (step 912);

Coupling the trigger trace to the thermal via, and to a laser package with a solder paste (step 914);

Coupling a thermal bridge to the thermal via with a solder paste (step 916);

Connecting a thermal paste to the thermal bridge and to the conductive ground plane (step 918); and Connecting the thermal paste to a mechanical housing (step 920).

In summary, in one embodiment, an apparatus for laser thermal management in a Light Detection and Ranging (LiDAR) system 102 of an autonomous vehicle 100 is provided. A printed circuit board 314 is provided with a laser driver 330 mounted on the printed circuit board. A trigger trace 312 on a top of the printed circuit board connects to an output of the laser driver. A plurality of laser diodes 404, 406 are connected in parallel for emitting a plurality of laser beams with a wavelength. A laser package has a substrate 308 coupled to an N-node 306, 422 of the plurality of laser diodes. A solder paste 310 couples the substrate of the laser package to the trigger trace. A plurality of thermal vias 316, 604 penetrate through the printed circuit board, connected to the trigger trace beneath the laser package. At least one conductive pad 318 is connected to the thermal vias on a bottom of the printed circuit board. At least one thermal bridge 322 connects to the at least one conductive pad on a bottom of the printed circuit board. A thermal paste 324 connects to the at least one thermal bridge. A conductive ground plane 326 on the bottom of the printed circuit board is connected to the thermal paste, and a mechanical housing 328 is connected to the thermal paste.

Example LiDAR System Implementing Aspects of Embodiments Herein

Figure 10:
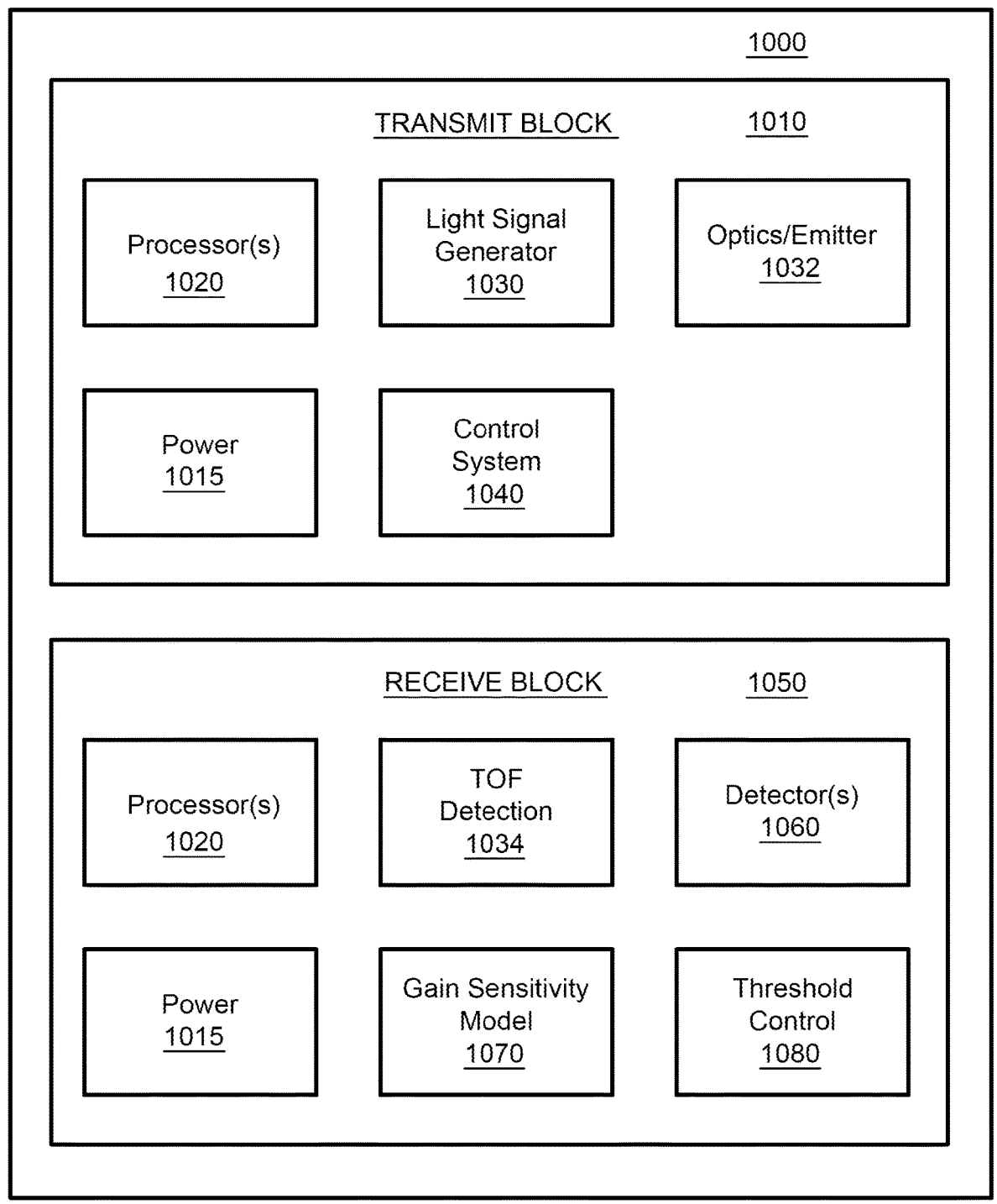
FIG. 10 illustrates a simplified block diagram showing aspects of a LiDAR-based detection system, according to certain embodiments of the invention.

FIG. 10 illustrates a simplified block diagram showing aspects of a LiDAR-based detection system 1000, according to certain embodiments, in which the embodiments described above can be imbedded and controlled. System 1000 may be configured to transmit, detect, and process LiDAR signals to perform object detection as described above with regard to LiDAR system 1000 described in FIG. 1. In general, a LiDAR system 1000 includes one or more transmitters (e.g., transmit block 1010) and one or more receivers (e.g., receive block 1050). LiDAR system 1000 may further include additional systems that are not shown or described to prevent obfuscation of the novel features described herein.

Transmit block 1010, as described above, can incorporate a number of systems that facilitate that generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 10, transmit block 1010 can include processor(s) 1020, light signal generator 1030, optics/emitter module 1032, power block 1015 and control system 1040. Some or all of system blocks 1030-1040 can be in electrical communication with processor(s) 1020.

In certain embodiments, processor(s) 1020 may include one or more microprocessors (μCs) and can be configured to control the operation of system 1000. Alternatively or additionally, processor 1020 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Alternatively, MCUs, μCs, DSPs, ASIC, programmable logic device, and the like, may be configured in other system blocks of system 1000. For example, control system block 1040 may include a local processor to control certain parameters (e.g., operation of the emitter). In particular, the processors 1020 can function as LiDAR controller 332 of FIG. 3, controlling laser driver 330. Processor(s) 1020 may control some or all aspects of transmit block 1010 (e.g., optics/emitter 1032, control system 1040, dual sided mirror 220 position as shown in FIG. 1, position sensitive device 250, etc.), receive block 1050 (e.g., processor(s) 1020) or any aspects of LiDAR system 1000. In some embodiments, multiple processors may enable increased performance characteristics in system 1000 (e.g., speed and bandwidth), however multiple processors are not required, nor necessarily germane to the novelty of the embodiments described herein. Alternatively or additionally, certain aspects of processing can be performed by analog electronic design, as would be understood by one of ordinary skill in the art.

Light signal generator 1030 may include circuitry (e.g., a laser diode) configured to generate a light signal, which can be used as the LiDAR send signal, according to certain embodiments. In some cases, light signal generator 1030 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 1032 (also referred to as transmitter 1032) may include one or more arrays of mirrors (including but not limited to dual sided mirror 220 as described above in FIGS. 1-6) for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 1032 may include a beam splitter to divert and sample a portion of the pulsed signal. For instance, the sampled signal may be used to initiate the TOF clock. In some cases, the sample can be used as a reference to compare with backscatter signals. Some embodiments may employ micro electromechanical mirrors (MEMS) that can reorient light to a target field. Alternatively or additionally, multi-phased arrays of lasers may be used. Any suitable system may be used to emit the LiDAR send pulses, as would be appreciated by one of ordinary skill in the art.

Power block 1015 can be configured to generate power for transmit block 1010, receive block 1050, as well as manage power distribution, charging, power efficiency, and the like. In some embodiments, power management block 1015 can include a battery (not shown), and a power grid within system 1000 to provide power to each subsystem (e.g., control system 1040, etc.). The functions provided by power management block 1015 may be subsumed by other elements within transmit block 1010, or may provide power to any system in LiDAR system 1000. Alternatively, some embodiments may not include a dedicated power block and power may be supplied by a number of individual sources that may be independent of one another.

Control system 1040 may control aspects of light signal generation (e.g., pulse shaping), optics/emitter control, TOF timing, or any other function described herein. In some cases, aspects of control system 1040 may be subsumed by processor(s) 1020, light signal generator 1030, or any block within transmit block 1010, or LiDAR system 1000 in general.

Receive block 1050 may include circuitry configured to detect and process a return light pulse to determine a distance of an object, and in some cases determine the dimensions of the object, the velocity and/or acceleration of the object, and the like. Processor(s) 1065 may be configured to perform operations such as processing received return pulses from detectors(s) 1060, controlling the operation of TOF module 1034, controlling threshold control module 1080, or any other aspect of the functions of receive block 1050 or LiDAR system 1000 in general.

TOF module 1034 may include a counter for measuring the time-of-flight of a round trip for a send and return signal. In some cases, TOF module 1034 may be subsumed by other modules in LiDAR system 1000, such as control system 1040, optics/emitter 1032, or other entity. TOF modules 1034 may implement return "windows" that limit a time that LiDAR system 1000 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 1034 may operate independently or may be controlled by other system block, such as processor(s) 1020, as described above. In some embodiments, the transmit block may also include a TOF detection module. One of ordinary skill in the art with the benefit of this disclosure would appreciate the many modifications, variations, and alternative ways of implementing the TOF detection block in system 1000.

Detector(s) 1060 may detect incoming return signals that have reflected off of one or more objects. In some cases, LiDAR system 1000 may employ spectral filtering based on wavelength, polarization, and/or range to help reduce interference, filter unwanted frequencies, or other deleterious signals that may be detected. In particular, a narrow pass-band filter can be used, either static or dynamic. A passband as narrow as 20 or even 15 nm may be used. Typically, detector(s) 1060 can detect an intensity of light and records data about the return signal (e.g., via coherent detection, photon counting, analog signal detection, or the like). Detector (s) 1060 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 1070 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 1070 may employ one or more look up tables (e.g., stored in a local or remote database) that can associate a gain value with a particular detected distance or associate an appropriate mathematical relationship there between (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in the LiDAR system as described herein. However, any suitable gain sensitivity profile can be used including, but not limited to, Oren-Nayar model, Nanrahan-Krueger model, Cook-Torrence model, Diffuse BRDF model, Limmel-Seeliger model, Blinn-Phong model, Ward model, HTSG model, Fitted Lafortune model, or the like. One of ordinary skill in the art with the benefit of this disclosure would understand the many alternatives, modifications, and applications thereof.

Threshold control block 1080 may set an object detection threshold for LiDAR system 1000. For example, threshold control block 1080 may set an object detection threshold over a certain full range of detection for LiDAR system 1000. The object detection threshold may be determined based on a number of factors including, but not limited to, noise data (e.g., detected by one or more microphones) corresponding to an ambient noise level, and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not be expressly discussed, they should be considered as part of system 1000, as would be understood by one of ordinary skill in the art. For example, system 1000 may include a bus system (e.g., CAMBUS) to transfer power and/or data to and from the different systems therein. In some embodiments, system 1000 may include a storage subsystem (not shown). A storage subsystem can store one or more software programs to be executed by processors (e.g., in processor(s) 1020). It should be understood that "software" can refer to sequences of instructions that, when executed by processing unit(s) (e.g., processors, processing devices, etc.), cause system 1000 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 1000 may include aspects of gain sensitivity model 1070, threshold control 1080, control system 1040, TOF module 1034, or any other aspect of LiDAR system 1000.

It should be appreciated that system 1000 is meant to be illustrative and that many variations and modifications are possible, as would be appreciated by one of ordinary skill in the art. System 1000 can include other functions or capabilities that are not specifically described here. For example, LiDAR system 1000 may include a communications block (not shown) configured to enable communication between LiDAR system 1000 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 1000 is described with reference to particular blocks (e.g., threshold control block 1080), it is to be understood that these blocks are defined for understanding certain embodiments of the invention and it is not implied or intended that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 1000 may be combined with or operated by other sub-systems as informed by design. For example, power management block 1015 and/or threshold control block 1080 may be integrated with processor(s) 1020 instead of functioning as separate entities.

Example Computer Systems Implementing Aspects of Embodiments Herein

Figure 11:
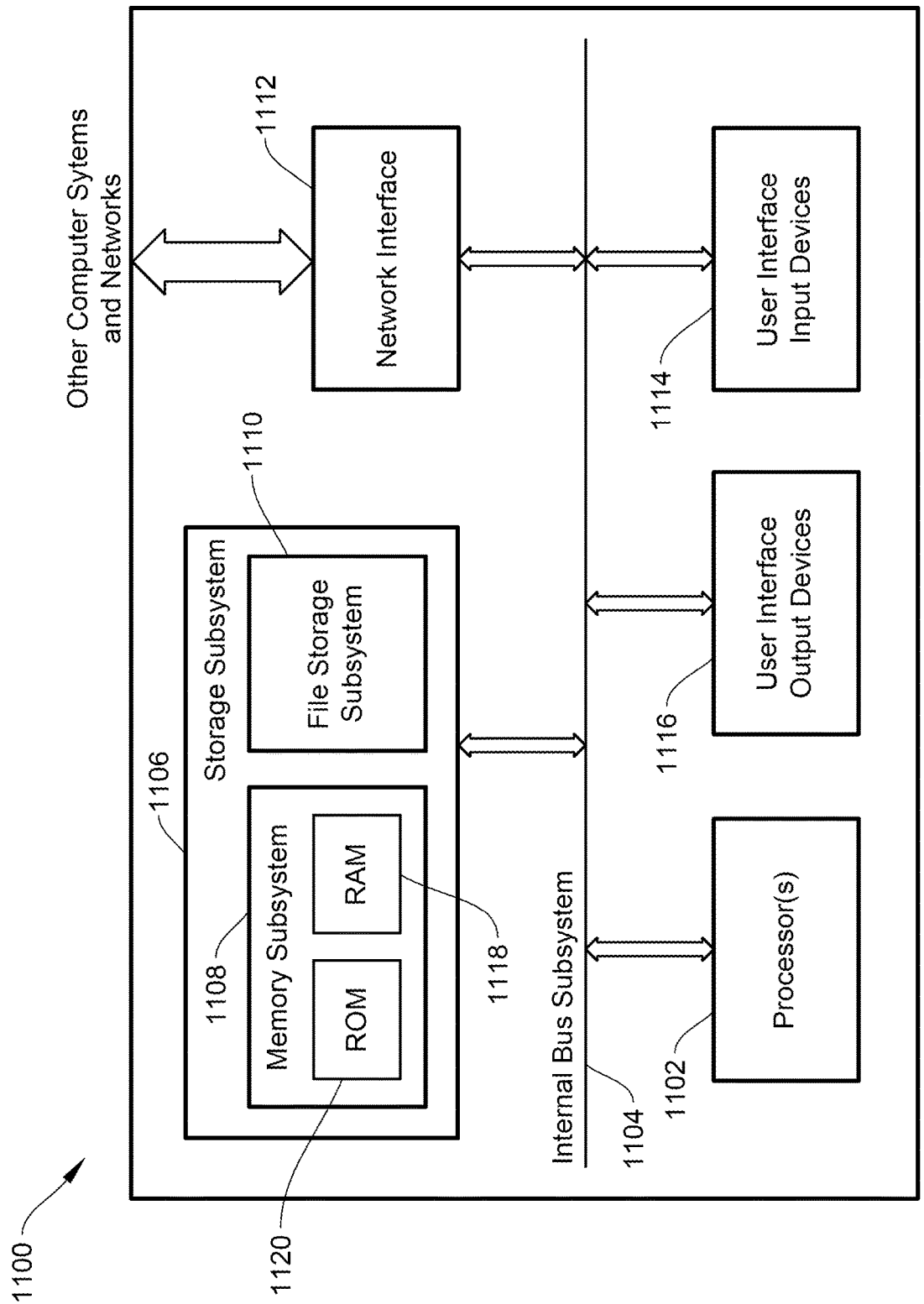
FIG. 11 illustrates an example computer system that may be utilized to implement techniques disclosed herein, according to certain embodiments of the invention.

FIG. 11 is a simplified block diagram of a computing system 1100 configured to operate aspects of a LiDAR-based detection system, according to certain embodiments. Computing system 1100 can be used to implement any of the systems and modules discussed above with respect to FIGS. 1-6. For example, computing system 1100 may operate aspects of threshold control 1080, TOF module 1034, processor(s) 1020, control system 1040, or any other element of LiDAR system 1000 or other system described herein. Computing system 1100 can include, for example, a field programmable gate array (FPGA), an application specific integrated circuit (ASIC), and a general purpose central processing unit (CPU), to implement the disclosed techniques, including the techniques described from FIG. 1-FIG. 9, such as controller 332. In some examples, computing system 1100 can also one or more processors 1102 that can communicate with a number of peripheral devices (e.g., input devices) via a bus subsystem 1104. Processors 1102 can be an FPGA, an ASIC, a CPU, etc. These peripheral devices can include storage subsystem 1106 (comprising memory subsystem 1108 and file storage subsystem 1110), user interface input devices 1114, user interface output devices 1116, and a network interface subsystem 1112.

In some examples, internal bus subsystem 1104 (e.g., CAMBUS) can provide a mechanism for letting the various components and subsystems of computer system 1100 communicate with each other as intended. Although internal bus subsystem 1104 is shown schematically as a single bus, alternative embodiments of the bus subsystem can utilize multiple buses. Additionally, network interface subsystem 1112 can serve as an interface for communicating data between computing system 1100 and other computer systems or networks. Embodiments of network interface subsystem 1112 can include wired interfaces (e.g., Ethernet, CAN, RS232, RS485, etc.) or wireless interfaces (e.g., ZigBee, Wi-Fi, cellular, etc.).

In some cases, user interface input devices 1114 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computing system 1100. Additionally, user interface output devices 1116 can include a display subsystem, a printer, or non-visual displays such as audio output devices, etc. The display subsystem can be any known type of display device. In general, use of the term "output device" is intended to include all possible types of devices and mechanisms for outputting information from computing system 1100.

Storage subsystem 1106 can include memory subsystem 1108 and file/disk storage subsystem 1110. Subsystems 1108 and 1110 represent non-transitory computer-readable storage media that can store program code and/or data that provide the functionality of embodiments of the present disclosure. In some embodiments, memory subsystem 1108 can include a number of memories including main random access memory (RAM) 1118 for storage of instructions and data during program execution and read-only memory (ROM) 1120 in which fixed instructions may be stored. File storage subsystem 1110 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 1100 is illustrative and not intended to limit embodiments of the present disclosure. Many other configurations having more or fewer components than system 1100 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of using a single laser to illuminate the array of MEMS mirrors, an array of mirrors may be used. Also, the pattern generation and decoding could be hardwired, in firmware or in software in different embodiments.

The MEMS mirror structure of the present invention can be used in a variety of other applications than LIDAR. Light beam steering techniques can also be used in other optical systems, such as optical display systems (e.g., TVs), optical sensing systems, optical imaging systems, and the like. In various light beam steering systems, the light beam may be steered by, for example, a rotating platform driven by a motor, a multi-dimensional mechanical stage, a Galvo-controlled mirror, a resonant fiber, an array of microelectromechanical (MEMS) mirrors, or any combination thereof. A MEMS micro-mirror may be rotated around a pivot or connection point by, for example, a micro-motor, an electromagnetic actuator, an electrostatic actuator, or a piezoelectric actuator.

The MEMS mirror structure of the present invention can have the mirror mass driven by different types of actuators. In some light steering systems, the transmitted or received light beam may be steered by an array of micro-mirrors. Each micro-mirror may rotate around a pivot or connection point to deflect light incident on the micro-mirror to desired directions. The performance of the micro-mirrors may directly affect the performance of the light steering system, such as the field of view (FOV), the quality of the point cloud, and the quality of the image generated using a light steering system. For example, to increase the detection range and the FOV of a LiDAR system, micro-mirrors with large rotation angles and large apertures may be used, which may cause an increase in the maximum displacement and the moment of inertia of the micro-mirrors. To achieve a high resolution, a device with a high resonant frequency may be used, which may be achieved using a rotating structure with a high stiffness. It may be difficult to achieve this desired performance using electrostatic actuated micro-mirrors because comb fingers used in an electrostatic-actuated micro-mirror may not be able to provide the force and moment needed and may disengage at large rotation angles, in particular, when the aperture of the micro-mirror is increased to improve the detection range. Some piezoelectric actuators may be used to achieve large displacements and large scanning angles due to their ability to provide a substantially larger drive force than electrostatic-actuated types, with a relatively lower voltage.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. An apparatus for laser thermal management in a Light Detection and Ranging (LiDAR) system of an autonomous vehicle, the apparatus comprising:
    a printed circuit board;
    a laser driver mounted on the printed circuit board;
    a trigger trace on a top of the printed circuit board, connected to an output of the laser driver;
    a plurality of laser diodes in parallel for emitting a plurality of laser beams with a wavelength;
    a laser package having a substrate coupled to an N-node of the plurality of laser diodes;
    a solder paste coupling the substrate of the laser package to the trigger trace;
    a plurality of thermal vias through the printed circuit board, connected to the trigger trace beneath the laser package;
    at least one conductive pad connected to the thermal vias on a bottom of the printed circuit board;
    at least one thermal bridge connected to the at least one conductive pad on a bottom of the printed circuit board;
    a thermal paste connected to the at least one thermal bridge;
    a conductive ground plane on the bottom of the printed circuit board, connected to the thermal paste; and
    a mechanical housing connected to the thermal paste;
    whereby a thermal heat dissipation path is created from the laser package through the solder paste, the plurality of thermal vias, the conductive pad, the thermal bridge, the thermal paste, the conductive ground plane and the mechanical housing.

2. The apparatus of claim 1 wherein:
    the printed circuit board is a rigid laminate; and
    the thermal paste is BeO.

3. The apparatus of claim 1 wherein the at least one thermal via is solid copper.

4. The apparatus of claim 1 wherein the at least one thermal via is a plurality of copper, hollow vias.

5. The apparatus of claim 1 wherein a cross sectional area of the plurality of thermal vias is at least ten times a cross sectional area of the trigger trace.

6. The apparatus of claim 1 further comprising a Field Effect Transistor (FET) coupled between the laser driver and the N-node of the plurality of laser diodes, with a drain of the FET connected to the N-node of the plurality of laser diodes.

7. The apparatus of claim 1 further comprising:
a heat sink connected to the mechanical housing.

8. An apparatus comprising:
a printed circuit board;
a laser package mounted on the printed circuit board;
at least one thermal via through the printed circuit board, coupled to the laser package;
a thermal bridge coupled to the at least one thermal via;
a thermal paste connected to the thermal bridge;
a conductive ground plane on a bottom of the printed circuit board, connected to the thermal paste; and
a mechanical housing connected to the thermal paste;
whereby a thermal heat dissipation path is created from the laser package through the thermal via, the thermal bridge, the thermal paste, the conductive ground plane and the mechanical housing.

9. The apparatus of claim 8 further comprising:
a laser driver mounted on the printed circuit board; and
a trigger trace on a top of the printed circuit board, connected to an output of the laser driver and to the laser package.

10. The apparatus of claim 9 further comprising:
a laser diode in the laser package; and
a solder paste coupling a substrate of the laser package to the trigger trace and to an N node of the laser diode.

11. The apparatus of claim 8 further comprising:
a conductive pad connected to the thermal via on a bottom of the printed circuit board; and
a solder paste connecting the conductive pad to the thermal bridge.

12. The apparatus of claim 8 wherein the thermal via comprises a plurality of thermal vias, and further comprising:
a plurality of laser diodes in the laser package.

13. The apparatus of claim 8 wherein the at least one thermal via is solid copper.

14. The apparatus of claim 8 wherein the at least one thermal via is a plurality of copper, hollow vias.

15. The apparatus of claim 8 further comprising:
a laser driver mounted on the printed circuit board; and
a trigger trace on a top of the printed circuit board, connected to an output of the laser driver and to the laser package;
a plurality of laser diodes in the laser package; and
wherein a cross sectional area of the thermal via is at least ten times a cross sectional area of the trigger trace.

16. The apparatus of claim 15 further comprising a Field Effect Transistor (FET) coupled between the laser driver and an N-node of the plurality of laser diodes, with a drain of the FET connected to the N-node of the plurality of laser diodes.

17. The apparatus of claim 8 wherein:
the printed circuit board is a rigid laminate; and
the thermal paste is BeO.

18. A method comprising:
providing a printed circuit board;
forming a thermal via through the printed circuit board;
forming a conductive ground plane on a bottom of the printed circuit board;
mounting a laser package on the printed circuit board, coupled to the thermal via;
coupling a thermal bridge to the thermal via;
connecting a thermal paste to the thermal bridge and to the conductive ground plane; and
connecting the thermal paste to a mechanical housing;
whereby a thermal heat dissipation path is created from the laser package through the thermal via, the thermal bridge, the thermal paste, the conductive ground plane and the mechanical housing.

19. The method of claim 18 wherein forming a thermal via further comprising electroplating copper in a via hole.

20. The method of claim 18 further comprising:
forming a trigger trace on the printed circuit board;
attaching a driver circuit to the trigger trace;
coupling the trigger trace to the laser package with a solder paste.

* * * * *